United States Patent
Shiokawa et al.

(10) Patent No.: US 10,727,512 B2
(45) Date of Patent: Jul. 28, 2020

(54) DEVICE FOR MONITORING ELECTRICITY GENERATION AND METHOD FOR MONITORING ELECTRICITY GENERATION

(71) Applicant: TOYOTA JIDOSHA KABUSHIKI KAISHA, Toyota-shi, Aichi-ken (JP)

(72) Inventors: Satoshi Shiokawa, Okazaki (JP); Tetsuya Bono, Miyoshi (JP); Osamu Hamanoi, Toyota (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 539 days.

(21) Appl. No.: 14/879,898

(22) Filed: Oct. 9, 2015

(65) Prior Publication Data

US 2016/0116539 A1  Apr. 28, 2016

(30) Foreign Application Priority Data

Oct. 28, 2014 (JP) ................ 2014-218947

(51) Int. Cl.
| | |
|---|---|
| *H01M 8/04537* | (2016.01) |
| *H01M 8/04746* | (2016.01) |
| *G01R 19/165* | (2006.01) |
| *G01R 31/396* | (2019.01) |
| *G01R 31/3835* | (2019.01) |

(52) U.S. Cl.
CPC ... *H01M 8/04559* (2013.01); *H01M 8/04753* (2013.01); *G01R 19/16542* (2013.01); *G01R 31/3835* (2019.01); *G01R 31/396* (2019.01)

(58) Field of Classification Search
CPC .......... H01M 8/04753; H01M 8/04559; G01R 19/16542

USPC ........................................... 324/426
See application file for complete search history.

(56) References Cited

U.S. PATENT DOCUMENTS

| | | | |
|---|---|---|---|
| 2006/0194082 A1 | 8/2006 | Tucker et al. | |
| 2008/0299428 A1* | 12/2008 | Miyata | H01M 8/0432 429/430 |
| 2010/0068576 A1* | 3/2010 | Hamada | H01M 8/04559 429/411 |
| 2010/0114513 A1 | 5/2010 | Mallavarapu et al. | |
| 2010/0136447 A1* | 6/2010 | Kumei | H01M 8/04082 429/431 |
| 2011/0294026 A1* | 12/2011 | Hamada | H01M 8/04388 429/432 |

(Continued)

FOREIGN PATENT DOCUMENTS

| | | |
|---|---|---|
| DE | 10 2009 050 943 A1 | 5/2010 |
| JP | 2005-019042 A | 1/2005 |

(Continued)

*Primary Examiner* — Richard Isla
*Assistant Examiner* — Johali A Torres Ruiz
(74) *Attorney, Agent, or Firm* — Finnegan, Henderson, Farabow, Garrett & Dunner, LLP

(57) ABSTRACT

A device for monitoring electricity generation comprising: an acquirer that acquires a total value of cell voltage from multiple cells including fuel cells; an increaser that increases the anode gas now rate to the multiple cells when the total value shows a possibility of negative voltage occurring in some of the multiple cells; and a judger that judges if negative voltage occurred in some of the multiple cells based on the total value following the increase of the anode gas flow rate.

14 Claims, 5 Drawing Sheets

(56) References Cited

U.S. PATENT DOCUMENTS

| | | | | |
|---|---|---|---|---|
| 2012/0141898 A1* | 6/2012 | Tanaka | ............... | H01M 8/04097 429/431 |
| 2012/0237841 A1* | 9/2012 | Reiners | ............... | H01M 8/0618 429/415 |
| 2013/0095405 A1* | 4/2013 | Kawahara | ......... | H01M 8/04552 429/431 |
| 2013/0189596 A1 | 7/2013 | Kawahara et al. | | |
| 2015/0093668 A1* | 4/2015 | Fukatsu | ............ | H01M 8/04104 429/432 |

FOREIGN PATENT DOCUMENTS

| | | |
|---|---|---|
| JP | 2008-300299 A | 12/2008 |
| JP | 2011-249078 A | 12/2011 |
| JP | 2013-069489 | 4/2013 |
| JP | 2013-187178 A | 9/2013 |
| JP | 2013-258111 | 12/2013 |

\* cited by examiner

DEVICE FOR MONITORING ELECTRICITY GENERATION AND METHOD FOR MONITORING ELECTRICITY GENERATION

CROSS-REFERENCE TO RELATED APPLICATIONS

The present application claims priority on the basis of Japanese patent application number 2014-218947 filed on Oct. 28, 2014, with the entirety of that disclosure incorporated into this application by way of reference.

BACKGROUND

1. Field

The present invention relates to the monitoring of electricity generated by fuel cells.

2. Related Art

There is a known device that measures the voltage of each of multiple cells comprising a fuel cell stack and monitors electricity generation status (JP2013-69489).

SUMMARY

In the case of the prior art above, the voltage of each of multiple cells is measured, making it difficult to accurately ascertain the voltage of the cells one by one. Thus, with such methods, there is a risk of overlooking the occurrence of negative voltage in some of the cells among multiple cells. Because the occurrence of negative voltage leads to cell degradation, it is desirable to detect it properly. Considering the above prior art, the problem the invention of this application attempts to solve is the detection of negative voltage occurrence, even when using the method of monitoring electricity generation status based on the voltage of each of multiple cells.

The purpose of the invention is to solve the above problem, which will be achieved in the below aspects.

One aspect provides a device for monitoring electricity generation. This device for monitoring electricity generation is provided with an acquirer that acquires a total value of cell voltage from multiple cells including fuel cells; an increaser that increases the anode gas flow rate to the multiple cells when the total value shows a possibility of negative voltage occurring in some of the multiple cells; and a judgement part that judges if negative voltage occurred in some of the multiple cells based on the total value following the increase of the anode gas flow rate. This aspect makes it possible to judge based on the total value of cell voltage from multiple cells whether negative voltage occurred in some of the multiple cells.

In the above aspect, when the total value reaches more than a reference voltage value following the increase in the anode gas flow rate, the judger may judge that negative voltage occurred in some of the multiple cells. This aspect makes judgement easy because it uses comparison with a reference value.

In the above aspects, when the total value did not reach a designated voltage value once a designated amount of time had elapsed following the increase in the anode gas flow rate, the judger may judge that negative voltage did not occur in any of the multiple cells. This aspect makes it possible to judge that negative voltage did not occur.

In the above aspects, when it is inferred that the cell voltage of some of the multiple cells is zero following the increase in the anode gas flow rate, the judger may judge that negative voltage did not occur in any of the multiple cells. This aspect makes it possible to judge that negative voltage did not occur.

In the above aspects, after the judger has made a judgement, the increaser may return the anode gas flow rate to its normal value. This aspect makes it possible to curb the exacerbation of fuel consumption.

In the above aspects, when the frequency of judgements that negative voltage has occurred in some of the multiple cells is above a designated frequency, output generated by the fuel cell may be restricted. This aspect makes it possible to curb cell degradation due to negative voltage.

In the above aspects, when the total value is below a threshold voltage, electricity generation by the fuel cell may be restricted. This aspect makes it possible to properly restrict voltage.

In the above aspects, when the electric current generated by the fuel cell is above a designated value, electricity generation by the fuel cell may be restricted. This aspect makes it possible to curb cell degradation.

These aspects may be realized through various aspects other than those above. For example, it may be realized through aspects such as electricity generation restriction methods, computer programs meant to realize those methods, and non-temporary storage media retaining those computer programs.

DESCRIPTION OF THE EMBODIMENTS

Figure 1:
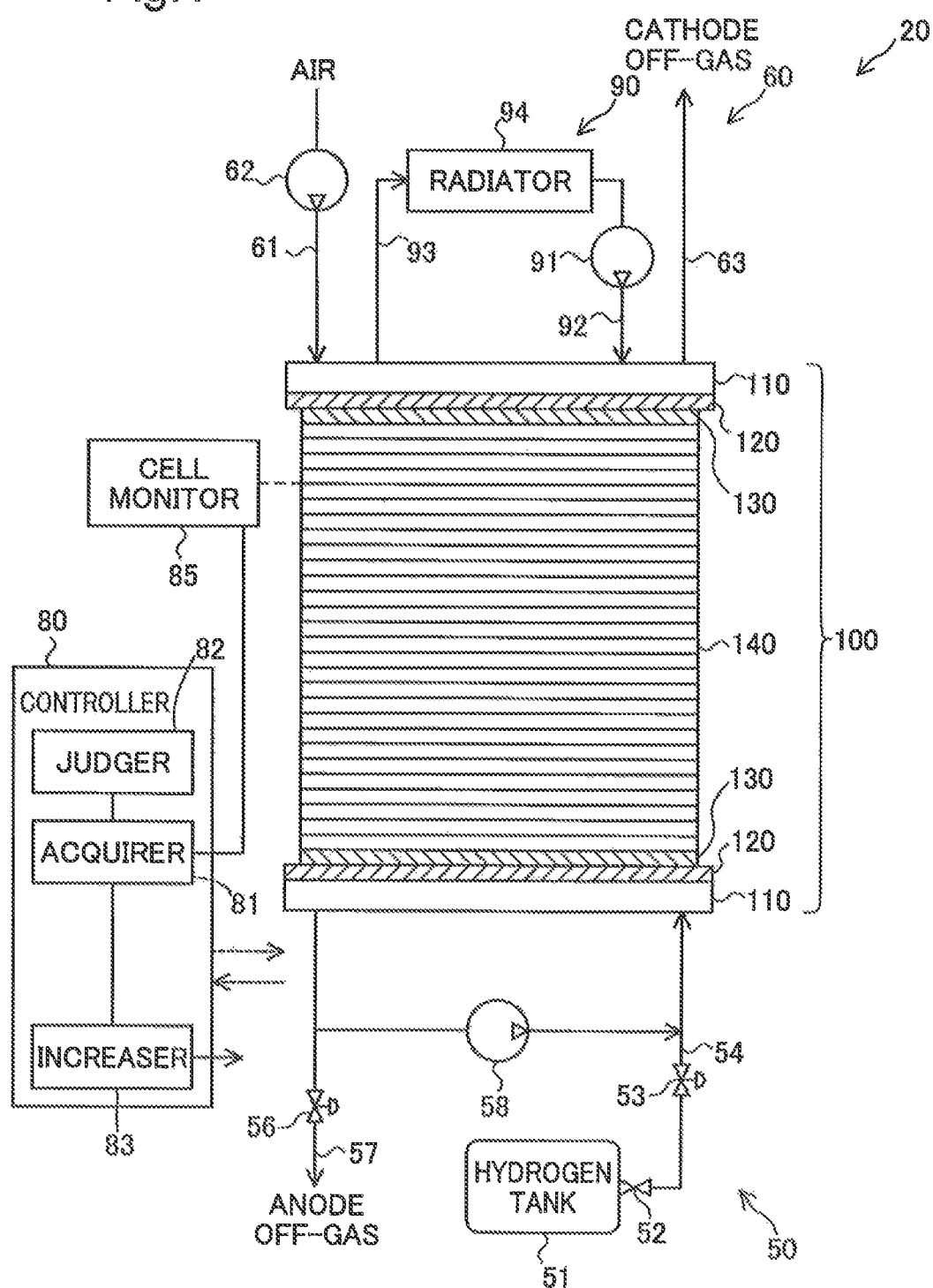
FIG. 1 is a schematic diagram of a fuel cell system.

FIG. 1 shows a schematic of a fuel cell system 20 that is installed in automobiles. The fuel cell system 20 is provided with an anode system 50, a cathode system 60, a controller 80, a cell monitor 85, a cooling system 90, and a fuel cell 100. Fuel cell 100 possesses a stacked structure, with layers in the following order: an end plate 110, an insulating plate 120, a collector plate 130, multiple (e.g. 400) cells 140, a collector plane 130 an insulating plate 120, and an end plate 110.

The anode system 50 is provided with a hydrogen tank 51, a tank valve 52, a regulator 53, piping 54, a discharge control valve 56, discharge piping 57, and a circulation pump 58. The hydrogen stored in the hydrogen tank 51 is provided to an anode of the fuel cell 100 through the tank valve 52, the regulator 53, and the piping 54.

When the discharge control valve 56 is open, anode off-gas (including water that has formed) is discharged from the discharge piping 57. The circulation pump 58 brings the anode off-gas back into the piping 54.

The cathode system 60 is provided with piping 61, an air compressor 62, and discharge piping 63. The air compressor 62 compresses air drawn in from the air and is provided to a cathode of the fuel cell 100 through the piping 61. Cathode off-gas (including water that has formed) is discharged into the air from the discharge piping 57.

The cooling system 90 is provided with a water pump 91, piping 92, piping 93, and a radiator 94. A cooling medium such as water is circulated by the water pump 91 through the piping 92, the fuel cell 100, the piping 93, and the radiator 94. The fuel cell 100 is cooled by waste heat from the fuel cell 100 being discharged into the air in the radiator 94.

The controller 80 is provided with an acquirer 81, a judgement part 82, and an increaser 83. The controller 80 controls electricity generation by the fuel cell 100 by controlling in an integrated manner the various aforementioned operations and by acquiring the information required for integrated control. The cell monitor 85 acquires the electricity generation status of the cell 140 and enters it into the controller 80.

Figure 2:
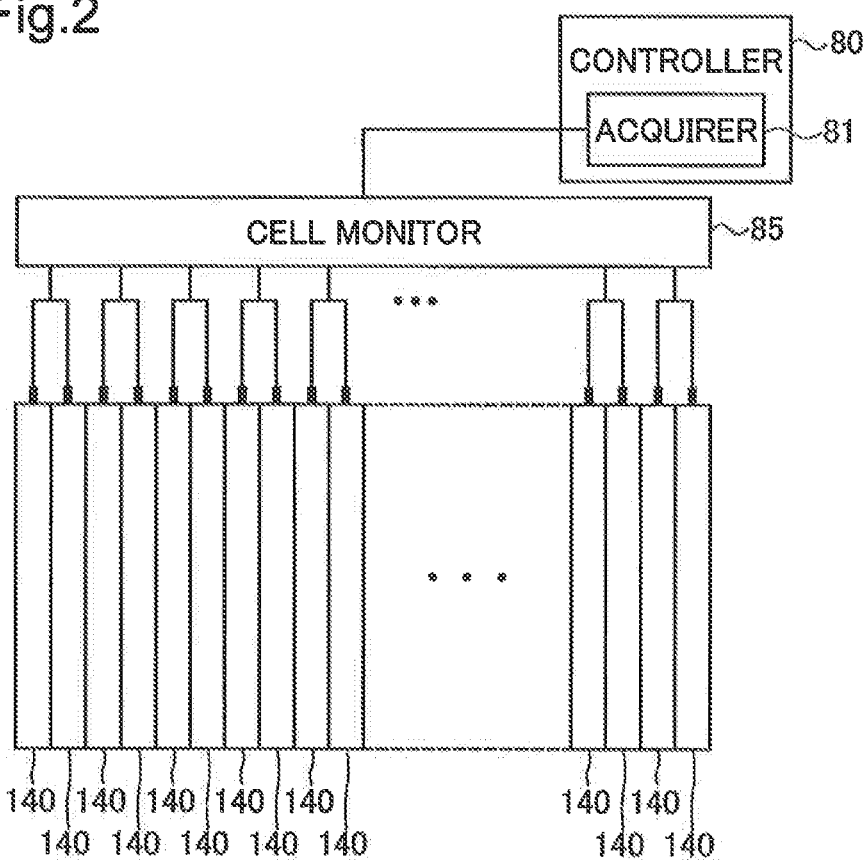
FIG. 2 shows how a cell monitor connects to cells.

FIG. 2 shows how the cell monitor 85 connects to the cell 140. The cell monitor 85 measures the total value of cell voltage for each cell group. The acquirer 81 acquires the total value off cell voltage for each cell group. A cell group in the present embodiment is comprised of two of the cells 140 that are adjacent. The cell monitor 85 of such a configuration can be manufactured inexpensively in comparison to a configuration in which voltage is measured for each of the cells 140. "Total value" above is referred to as "measured voltage" below. One of the aims of acquiring the measured voltage is to detect the cell 140 in which negative voltage is occurring. This is because degradation advances in the cell 140 in which negative voltage has occurred.

However, because the measured voltage is a value that is the sum of the cell voltage of each of two of the cells 140, it is difficult to accurately ascertain the cell voltage of each based on the measured voltage. For instance, if measured voltage is 0.6V it is difficult to determine whether the cell voltage is 0.3V for each cell, 1V and −0.4V, or another combination of numerical values.

However, if the upper limit value for cell voltage is employed, it is possible to infer whether or not negative voltage is occurring. In this embodiment, the upper limit value of cell voltage is considered to be to fixed value (e.g. 1.0V), and this fixed value is referred to as "second voltage V2" below. The second voltage V2 is determined based on the current-voltage characteristics of the cell 140.

Figure 3:
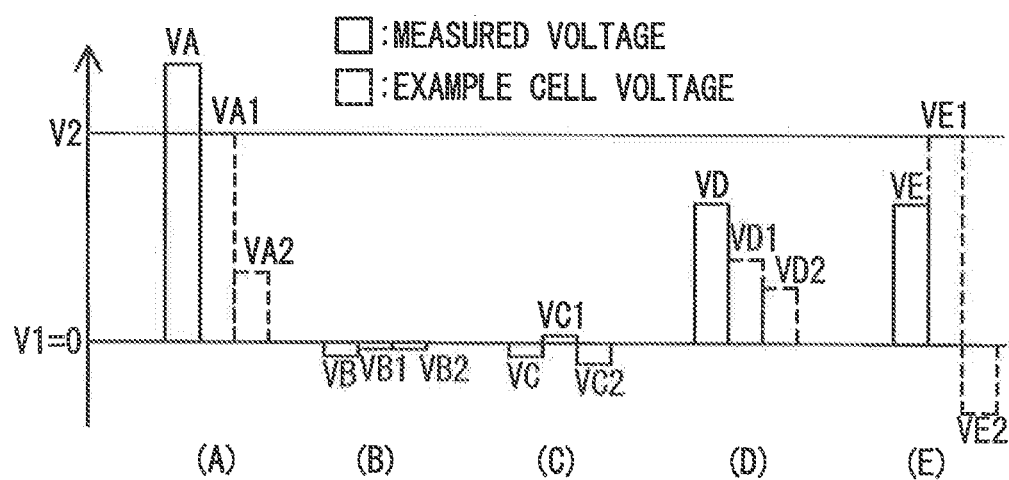
FIG. 3 is a bar graph showing the relationship between measured voltage and cell voltage.

FIG. 3 is a bar graph meant to describe the relationship between measured voltage and cell voltage. (A) in FIG. 3 illustrates a situation in which a measured voltage VA exceeds the second voltage V2. In this situation, it can be ascertained that a cell voltage VA1 and a cell voltage VA2 are both positive voltage.

Meanwhile, if there is a negative value such as a measured voltage VB and a measured voltage VC shown in (B) and (C) in FIG. 3, the occurrence of negative voltage can be ascertained immediately. (B) in FIG. 3 illustrates a situation in which a cell voltage VB1 and a cell voltage VB2 are both negative voltage, while (C) illustrates a situation in which a cell voltage VC1 is positive voltage and a cell voltages VC2 is negative voltage. The value used as a standard for making such determinations is referred to as "first voltage V1" below. The first voltage V1 of this embodiment is zero V.

(D) and (E) in FIG. 3 illustrate a situation in which a measured voltage VD and a measured voltage VE are above the first voltage V1 and below the second voltage V2. In such a situation, it is not possible to ascertain based on measured voltage whether or not negative voltage is occurring. In other words, although it is possible that a cell voltage VD1 and a cell voltage VD2 are both positive voltage as shown in (D) in FIG. 3, it is also possible that a cell voltage VE2 is negative voltage despite the fact that a cell voltage VE1 is positive voltage as shown in (E) in FIG. 3.

Figure 4:
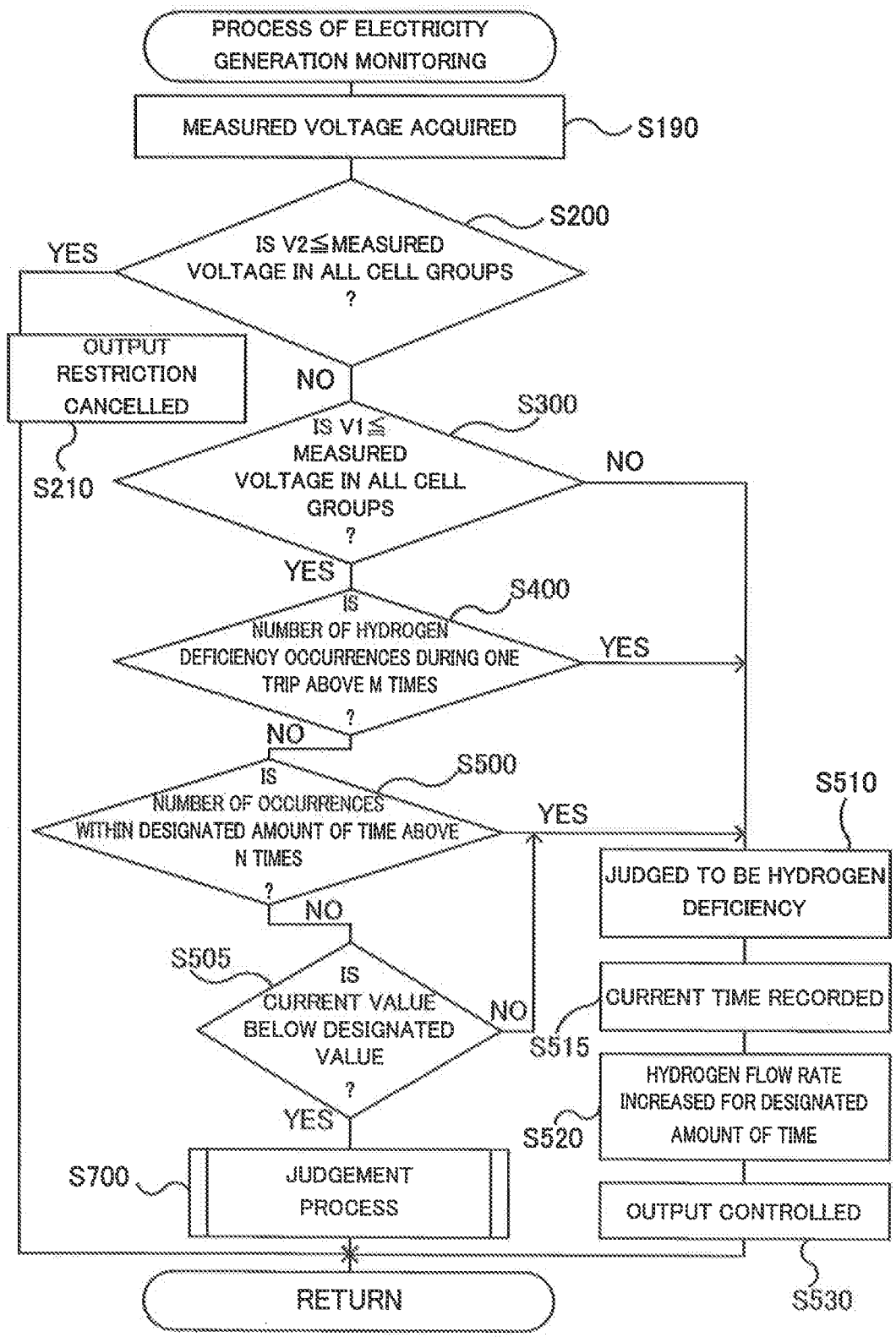
FIG. 4 is a flowchart showing the process of electricity generation monitoring.

FIG. 4 is a flowchart showing the process of electricity generation monitoring. Process of electricity generation monitoring is process for the handling of negative voltage based on information obtained from measured voltage, and is carried out repeatedly by the controller 80 during electricity generation by the fuel cell 100. By carrying out process of electricity generation monitoring, the controller 80 functions as a device for monitoring electricity generation that realizes a method for monitoring electricity generation.

First, the acquirer 81 acquires the measured voltages for all cell groups (a step S190). Next, the controller 80 judges whether the acquired measured voltages for all cell groups are above the second voltage V2 (a step S200). If at least some of the measured voltages for the cell groups are below the second voltage V2 (the step S200, NO), the controller 80 judges whether the measured voltages of all cell groups are above the first voltage V1 (a step S300). If at least some of the measured voltages for the cell groups are below the first voltage V1 (the step S300, NO), the judger 82 judges whether hydrogen deficiency is occurring in those cell groups (a step S510).

Figure 5:
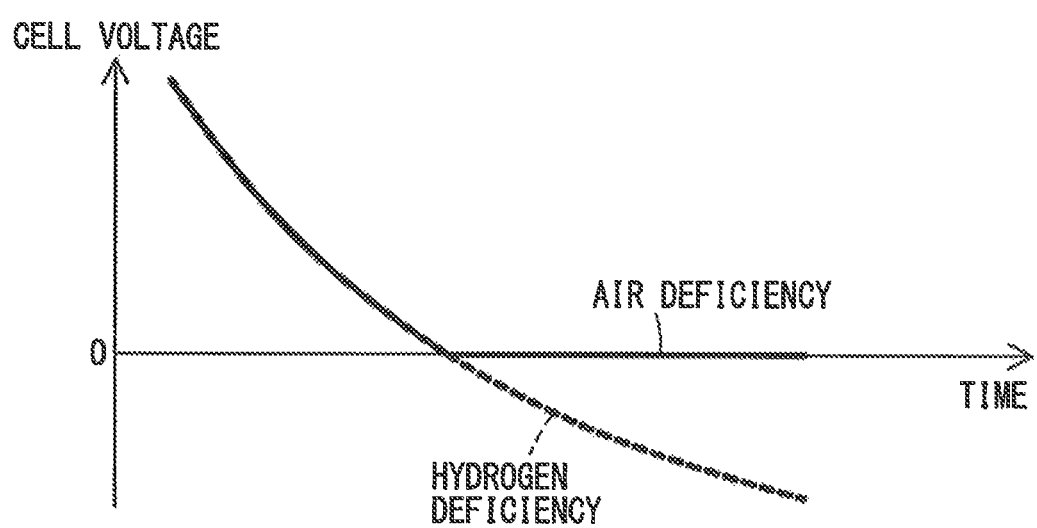
FIG. 5 is a graph showing changes in cell voltage when hydrogen deficiency and air deficiency have advanced.

FIG. 5 is a graph that schematically shows changes in cell voltage when hydrogen deficiency has occurred and when air deficiency has occurred. Hydrogen deficiency means astute in which the amount of hydrogen is lower than the amount required for normal electricity generation reactions in the cell 140. Air deficiency means a state in which the amount of oxygen is lower than the amount required for normal electricity generation reactions in the cell 140. When hydrogen deficiency advances, it causes negative voltage to occur as shown in FIG. 5. In contrast, the advance of air deficiency will not cause negative voltage to occur as long as zero V is maintained. Thus, if negative voltage is confirms, it can be judged that there is a hydrogen deficiency.

Next, the controller 80 records the current time (a step S515). This record is made for the purposes of a step S400 and a step S500, which will be described later. Afterward, the controller 80 controls the equipment for the anode system 50, and increases the hydrogen flow rate (a step S520), and then output is restricted (a step 530). Specifically, output generated by the fuel cell 100 is restricted such that it does not exceed an upper limit value. This upper limit value is a value lower than the upper limit value set during normal times. These steps curb degradation of the cell 140 due to negative voltage. In order to curb the exacerbation of fuel consumption, an increase in hydrogen flow rate is ended after a designated amount of time. Following that, process of electricity generation monitoring is ended.

Meanwhile, if the measured voltages for all cell groups are above the first voltage V1 (the step S300, YES), the controller 80 judges whether the number of hydrogen deficiency occurrences during one trip is above M times (M being any natural number) (the step S400). "One trip" refers to the period from a fuel cell starting to a fuel cell stopping. This judgement is made using the records made in the aforementioned step S515 and a step S755, which will be described later.

If the number of hydrogen deficiency occurrences during one trip is below M times (the step S400, NO), the controller 80 judges whether the number of hydrogen deficiency occurrences during the most recent designated amount of time is above N times (N being a natural number below M) (the step S500). If the number of hydrogen deficiency occurrences during the most recent designated amount of time is below N times (the step S500, NO), the controller 80 judges whether the current value of electricity generated by the fuel cell 100 is below a designated value (e.g. 50 A) (a step S505). If the current value is below the designated value (the step S505, YES), the controller 80 carries out judgement process (a step S700).

Figure 6:
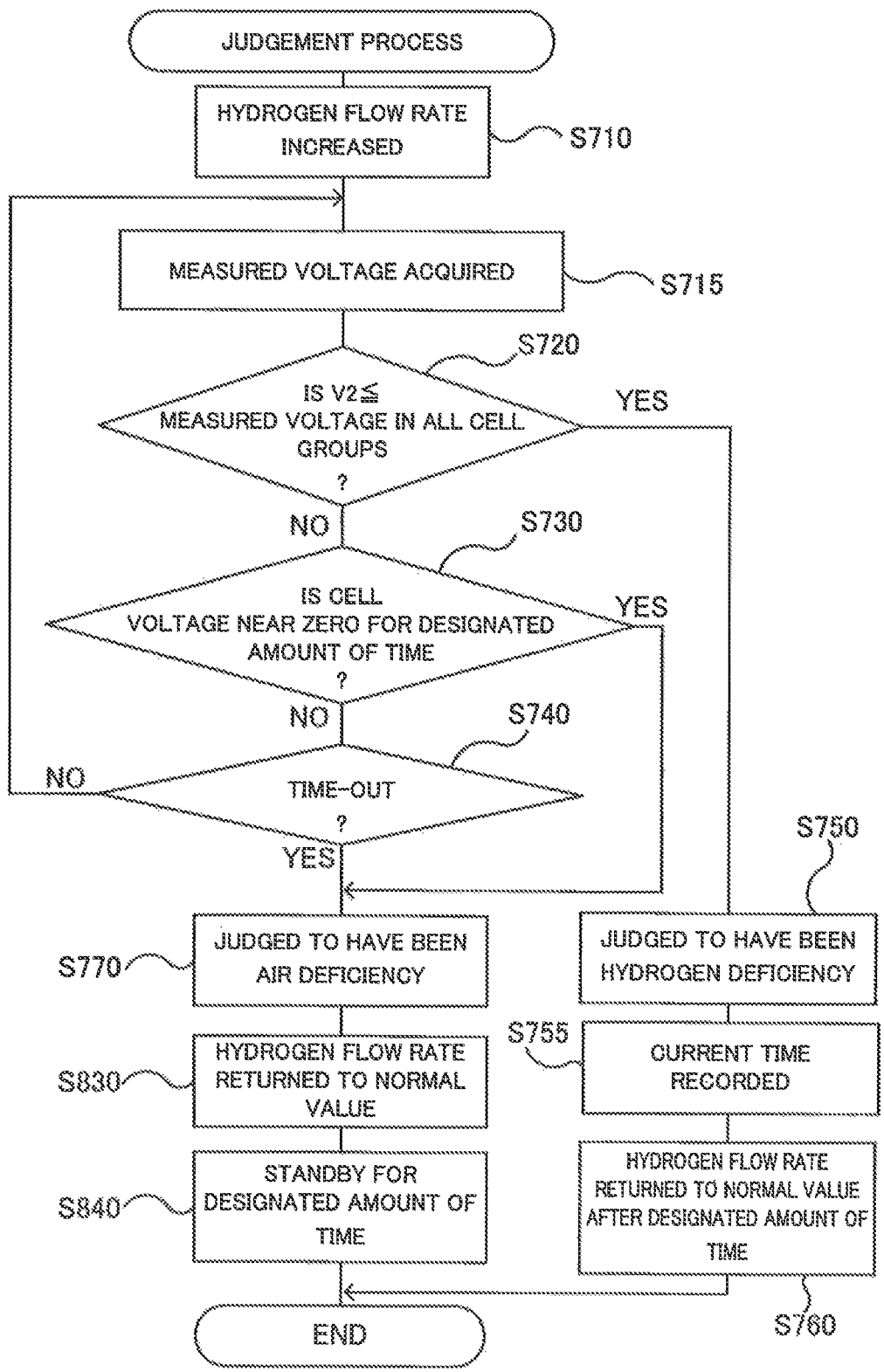
FIG. 6 is a flowchart showing judgement process.

FIG. 6 is a flowchart showing judgement process. First, the increaser 83 increases the hydrogen flow rate (a step S710). Then, the acquirer 81 acquires the measured voltages for all cell groups (a step S715). Next, the controller 80 judges whether the acquired measured voltages for all cell groups has reached above the second voltage V2 (a step S720). If the measured voltages for all cell groups are above the second voltage V2 (the step S720, YES), the judger 82 judges that hydrogen deficiency occurred at the point of the step S300 (a step S750). Hydrogen deficiency is often caused by insufficient supply of hydrogen gas, flooding, and the like. These root causes are often solved by increase hydrogen flow rate. Thus, judgements are made in the step S750 as described above.

Afterward, the controller 80 records the current time (the step S755). Then, the increaser 83 returns the hydrogen flow rate to its normal value after a designated amount of time (a step S760), and judgement process is ended. With that, process of electricity generation monitoring is ended. Output is not restricted because, although it is possible that negative voltage was occurring at the point of the step S300, negative voltage should not be occurring at the point of the step S750.

Meanwhile, if at least some of the measured voltages for the cell groups are below the second voltage V2 (the step S720, NO), the controller 80 judges whether it is inferred that, in all of those cell groups, the cell voltage of one of the cells 140 is near zero V (e.g. 0±0.02V) for a designated amount of time continuously (a step S730). Examples of judgements of the step S730 include a situation in which the measured voltage maintains a value slightly lower than the second voltage V2, or a situation in which, despite the measured value being slightly below the second voltage V2, cell voltage has stopped falling irrespective of the timing of hydrogen flow rate increase. In such situations, there is a high likelihood of air deficiency.

Meanwhile, if it is not inferred that the cell voltage of one of the cells 140 is near zero V for a designated amount of time continuously (the step S730, NO), the controller 80 judges whether a time-out occurred (a step S740). Specifically, if the amount of time elapsed reaches a designated amount of time using as a starting point the point at which hydrogen flow rate was increased in the step S710, a time-out is judged to have occurred. The designated amount of time in the step S740 is longer than the designated amount of time in the step S730.

If a time-out has not occurred (the step S740, NO), the controller 80 returns to the step S715 and repeats the aforementioned judgement. If time-out has occurred (the step S740, YES) and it is inferred that the cell voltage of one of the cells 140 is near zero V for a designated amount of time continuously (the step S730, YES), the judger 82 judges that air deficiency occurred at the point of the step 300 (a step S770), the increaser 83 returns the hydrogen flow rate to its normal value (a step S830), and, after standing by for a designated amount of time (a step S840), judgement process is ended. With that, process of electricity generation monitoring is ended.

The reason the hydrogen flow rate is immediately returned to normal values as described above is because an increase in the hydrogen flow rate is unnecessary in times of air deficiency. The controller 80 stands by for a designated amount of time to avoid delaying the timing of beginning the next loop of process of electricity generation monitoring and carrying out judgement process immediately. In this embodiment, because, as described above, no action is taken even if air deficiency occurs, there is a high likelihood of first voltage V1≤measured voltage<second voltage V2 at the point of the step S830. Thus, if the next loop of process of electricity generation monitoring is carried out, it leads to judgement process being carried out. However, because judgement process is unnecessary immediately following a judgement of air deficiency, a space of a designated amount of time is left as described above to curb the exacerbation of fuel consumption.

Further, as described above, the cell voltage of the cell 140 in which air deficiency occurred is zero V. In this way, even when electricity generation stops in some of the cells 140, electricity demand can usually be met through the electricity generated by the other cells 140. Thus, in this embodiment, even when air deficiency occurs, the controller 80 takes no action and does not carry out measures such as increasing the air flow rate.

When process of electricity generation monitoring is repeated, if the measured voltage is below the second voltage V2 (the step S200, NO) and above the first voltage V1 (the step S300, YES), sometimes the number of hydrogen deficiency occurrences during one trip will reach above M times (the step S400, YES) or the number of hydrogen deficiency occurrences during the most recent designated amount of time will reach above N times (the step S500, YES). In such times, the controller 80 does not perform judgement process and carries out the steps S510-S530 as described above. This is because, if the measure voltage drops again after hydrogen deficiency has occurred frequently, there is a high likelihood that hydrogen deficiency is the cause. Furthermore, if hydrogen deficiency has occurred frequently in this manner, output restriction is carried out (the step S530) for safety in addition to increasing the hydrogen deficiency flow rate.

Moreover, if the current value of the electricity generation by the fuel cell 100 is above a designated value (the step S505), the controller 80 does not perform judgement process and carries out the steps S510-S530 as described above. This is because, if hydrogen deficiency happens to be occurring when the current value is high, degradation of the cell 140 will advance in a short amount of time. As such, when the current value is above a designated value, this is considered to be hydrogen deficiency.

If the measured voltages for all cell groups are above the second voltage V2 (the step S200, YES), the controller 80 cancels output restriction (a step S210) and process of electricity generation monitoring is ended. Further, if output is not restricted, the step 210 is skipped.

With this embodiment, it is possible to detect hydrogen deficiency occurring in any of the cells 140, while reducing manufacturing costs through a configuration in which voltage is measured for each cell group. This makes it possible to avoid restricting output more than necessary. In other words, when hydrogen deficiency is monitored only through the measured voltage, the degradation of the cell 140 can be curbed if output is restricted when measured voltage<second voltage V2. However, this method leads to restricting output frequently and can have a negative effect on drive feeling and the like. In contrast, this embodiment makes it possible to avoid restricting output if there is judged to be air deficiency when first voltage V1≤measured voltage<second voltage V2. Furthermore, even when the measured voltage has been restored by increasing the hydrogen flow rate, restriction of output can be avoided while correcting hydrogen deficiency.

However, output is restricted when a possibility of negative voltage exists even with this embodiment. Specifically, as described above, when hydrogen deficiency occurs frequently, output is restricted without carrying out judgement process. This curbs degradation of the cell 140.

Additionally it also avoids excessively making increases in the hydrogen flow rate. In other words, if there is judged to be air deficiency, it is unnecessary to increase the hydrogen flow rate, and as such the flow rate is immediately returned to its previous level. In addition, even in the case of hydrogen deficiency, the flow rate is returned to its previous level after a designated amount of time has elapsed. These measures curb the exacerbation of fuel consumption.

This invention is not limited to the embodiments, practical examples, or modifications in the present specification, but can be realized using a variety of configurations to the extent that a configuration does not deviate from the general meaning therein. For instance, the technical features within the embodiments, practical examples, and modifications regarding the technical features within the various modes listed in the invention summary column can be replaced or combined as needed in order to solve all or some of the abovementioned problems, or in order to achieve all or some of the abovementioned results. If those technical features are not described as essential in this specification, they can be omitted as needed. For instance, this is exemplified below.

If there was judged to be hydrogen deficiency the hydrogen flow rate increase may be immediately returned to its previous level. This makes it possible to curb the exacerbation of fuel consumption. In this situation, when the measured voltage has not been restored, the output may be restricted.

The first voltage may be a value higher or lower than zero V. For example, if it is a value higher than zero V, the hydrogen flow rate is increased before hydrogen deficiency occurs, making it possible to prevent the occurrence of negative voltage beforehand.

The second voltage may be a value higher or lower than the upper limit value of cell voltage. For instance, if it is a value higher than the upper limit value of cell voltage, it is usually judged that "there is a possibility of negative voltage occurring," making it possible to better prevent the occurrence of negative voltage.

The second voltage may be a variable. For example, it may be an average voltage calculated, by measuring the total voltage of a cell group and dividing by the number of cells included in the cell group.

The number of cells comprising a cell group may be any plural number.

Cells that do not comprise a cell group may be included. In other words, cells for which the voltage of each one cell is calculated may be included.

The number of cells comprising a cell group does not need to be uniform.

Cells for which the voltage is not calculated may be included.

Judgements of hydrogen deficiency or air deficiency are not limited to the judgements of the embodiment. When cell degradation is being further curbed, judgements of hydrogen deficiency may be made in order to increase the judgements of hydrogen deficiency, except in situations where there is a considerably high likelihood of air deficiency. For instance, when measured voltage largely does not respond to an increase in the hydrogen flow rate, a judgement of air deficiency may be made, while a judgement of hydrogen deficiency may be made in any other situations.

Alternatively, when the priority is to avoid output restriction or curb the exacerbation of fuel consumption, judgements of air deficiency may be made in order to increase the judgements of air deficiency, except in situations where there is a considerably high likelihood of hydrogen deficiency. For instance, when measured voltage is immediately restored by an increase in the hydrogen flow rate, a judgement of hydrogen deficiency may be made, while a judgement of air deficiency may be made in any other situations.

Current value does not need to be considered when deciding whether or not to restrict output.

The acquisition of measured voltage, the increasing of hydrogen flow rate, and judgement process (judging whether or not negative voltage is occurring) may be carried out using separate ECUs.

The designated amount of time in the judgement for the step S500 may be variable. In other words, the point in time from which the number of hydrogen deficiency judgements are counted may be changed according to the circumstances. For example, when the total operation time for the fuel cell system is long and there is concern about cell degradation, the abovementioned designated amount of time may be lengthened and output restriction may be facilitated.

Use of the fuel cell does not need to be limited to automobiles. For instance, the fuel cell may be installed in transportation equipment (two-wheeled vehicles, trains, etc.) or may be used for the stationary generation of electricity.

In the abovementioned embodiment, at least some of the functions and process realized through software may be realized through hardware. Additionally, at least some of the functions and process realized through hardware may be realized through software. A variety of circuitry may be used as hardware, such as, for example, integrated circuits, discrete circuits, or circuit modules that are a combination of those circuits.

What is claimed is:

1. A device for monitoring electricity generation, the device comprising:
    an acquirer configured to acquire a voltage sum that is a sum of cell voltages of multiple cells of a fuel cell system;
    an increaser configured, when the voltage sum at a first time is greater than or equal to a first voltage and less than a second voltage such that the voltage sum shows a possibility of negative voltage occurring in at least one cell of the multiple cells, to increase an anode gas flow rate to the multiple cells at a second time occurring after the first time, wherein a voltage range from the first voltage to the second voltage is a range of voltage values in which it is not possible to judge if negative voltage is occurring in one cell of the multiple cells and non-negative voltage is occurring in other cells of the multiple cells; and
    a judger configured to judge if negative voltage occurred in the at least one cell of the multiple cells at the first time based on the voltage sum following the increase of the anode gas flow rate,
    wherein the judger is configured to judge that, when the voltage sum reaches more than a reference voltage value following the increase in the anode gas flow rate, negative voltage occurred in the at least one cell of the multiple cells, and
    wherein when the judger judges that negative voltage occurred in the at least one cell of the multiple cells at the first time, the increaser is configured to return the anode gas flow rate to its normal value after an amount of time elapses following the increase in the anode gas flow rate.

2. The device for monitoring electricity generation in accordance with claim 1, wherein the judger is further configured to:
   judge that negative voltage did not occur in any of the multiple cells at the first time when the voltage sum has not reached a designated voltage value after a designated amount of time has elapsed following the increase in the anode gas flow rate.

3. The device for monitoring electricity generation in accordance with claim 1, wherein the judger is further configured to:
   judge that negative voltage did not occur in any of the multiple cells at the first time when it is inferred that the cell voltage of the at least one cell of the multiple cells is zero following the increase in the anode gas flow rate.

4. The device for monitoring electricity generation in accordance with claim 1, wherein the device is configured to:
   restrict electricity generated by the fuel cell system when the frequency of judgments that negative voltage has occurred in the at least one cell of the multiple cells is above a designated frequency.

5. The device for monitoring electricity generation in accordance with claim 1, wherein the device is configured to:
   restrict electricity generated by the fuel cell system when the voltage sum is below a threshold voltage value.

6. The device for monitoring electricity generation in accordance with claim 1, wherein the device is configured to:
   restrict electricity generated by the fuel cell system when the electric current generated by the fuel cell system is above a designated current value.

7. A method for monitoring electricity generation, comprising:
   (a) measuring a voltage sum that is a sum of cell voltages of multiple cells of a fuel cell system;
   (b) increasing an anode gas flow rate to the multiple cells at a second time occurring after a first time when the voltage sum is greater than or equal to a first voltage and less than a second voltage such that the voltage sum shows a possibility of negative voltage occurring in at least one cell of the multiple cells, wherein a voltage range from the first voltage to the second voltage is a range in which it is not possible to judge if negative voltage is occurring in one cell of the multiple cells and non-negative voltage is occurring in other cells of the multiple cells;
   (c) judging whether negative voltage occurred in the at least one cell of the multiple cells at the first time based on the voltage sum following the increase of the anode gas flow rate; and
   (d) when it is judged in the step (c) that negative voltage occurred in the at least one cell of the multiple cells at the first time,
   returning the anode gas flow rate to its normal value after an amount of time elapses following the increase in the anode gas flow rate,
   wherein the step (c) includes judging that, when the voltage sum reaches more than a reference voltage value following the increase in the anode gas flow rate, negative voltage occurred in the at least one cell of the multiple cells.

8. The method for monitoring electricity generation in accordance with claim 7, wherein the step (c) further comprises:
   judging that negative voltage did not occur in any of the multiple cells at the first time when the voltage sum has not reached a designated voltage value after a designated amount of time has elapsed following the increase in the anode gas flow rate.

9. The method for monitoring electricity generation in accordance with claim 7, wherein the step (c) further comprises:
   judging that negative voltage did not occur in any of the multiple cells at the first time when it is inferred that the cell voltage of the at least one cell of the multiple cells is zero following the increase in the anode gas flow rate.

10. The method for monitoring electricity generation in accordance with claim 7, further comprising:
    restricting electricity generated by the fuel cell system when the frequency of judgments that negative voltage has occurred in the at least one cell of the multiple cells is above a designated frequency.

11. The method for monitoring electricity generation in accordance with claim 7, further comprising:
    restricting electricity generated by the fuel cell system when the voltage sum is below a threshold voltage value.

12. The method for monitoring electricity generation in accordance with claim 7, further comprising:
    restricting electricity generated by the fuel cell system when the electric current generated by the fuel cell system is above a designated current value.

13. The device for monitoring electricity generation in accordance with claim 1, wherein
    the voltage sum is the sum of the cell voltage of a first cell and the cell voltage of a second cell that is adjacent to the first cell.

14. The method for monitoring electricity generation in accordance with claim 7, wherein
    the voltage sum is the sum of the cell voltage of a first cell and the cell voltage of a second cell that is adjacent to the first cell.

* * * * *